United States Patent [19]

Johnston

[11] Patent Number: 4,977,367
[45] Date of Patent: Dec. 11, 1990

[54] RANGE SELECTOR SWITCH FOR ION CHAMBER INSTRUMENT

[75] Inventor: Joseph G. Johnston, Newbury, Ohio

[73] Assignee: Bicron Corporation, Newbury, Ohio

[21] Appl. No.: 149,654

[22] Filed: Jan. 28, 1988

[51] Int. Cl.$^5$ ............................................. G01R 1/30
[52] U.S. Cl. ................................ 324/115; 324/123 C; 307/254
[58] Field of Search .................. 324/115, 123 R, 111, 324/74, 130; 307/311, 359, 254; 250/374

[56] References Cited

U.S. PATENT DOCUMENTS

| | | | |
|---|---|---|---|
| 3,609,542 | 9/1971 | Burke | 324/111 |
| 3,725,661 | 4/1973 | Gripentog | 250/374 |
| 3,758,858 | 9/1973 | McCue | 324/115 |
| 3,778,710 | 12/1973 | Snook | 324/123 R |
| 4,137,428 | 1/1979 | Federico et al. | 307/311 |
| 4,222,270 | 9/1980 | Allen | 73/504 |
| 4,617,680 | 10/1980 | Johnston | 250/374 |

OTHER PUBLICATIONS

Muzii et al., Low Frequency Capacitance Measurements, 10/02/75, pp. 487–489, Electronics Letters, vol. 11, No. 2.

*Primary Examiner*—Reinhard J. Eisenzopf
*Assistant Examiner*—Edward Urban
*Attorney, Agent, or Firm*—Pearne, Gordon, McCoy & Granger

[57] ABSTRACT

An ion chamber type instrument for measuring radioactivity includes a high gain operational amplifier having a feedback network of range determining resistors connected between the amplifier output and input. Electronic switches in series with at least some of the range determining resistors function as range selector switches for the measuring instrument. Each switch includes two series-connected transistors and a third transistor, the interconnection point between the two series-connected transistors being connected to the electrical neutral point of a measuring circuit via the third transistor. Each switch, when in an "off" or non-conducting condition, provides a high effective resistance of, for example, $1 \times 10^{15}$ ohms so as to minimize errors caused by leakage current fed back into the input of the high gain operational amplifier.

1 Claim, 1 Drawing Sheet

4,977,367

RANGE SELECTOR SWITCH FOR ION CHAMBER INSTRUMENT

BACKGROUND OF THE INVENTION

The present invention relates in general to switches, and more particularly to a switch used as a range selector switch in an ion chamber type instrument for measuring radioactivity.

Ion chamber instruments are well known in the art of detecting and measuring beta, gamma, and x-ray radiation. Examples of such instruments are a Model RO-2 Ion Chamber Instrument sold by Eberline Instrument Corporation of Sante Fe, New Mex., and a Model RSO-50 Ion Chamber Survey Meter sold by the assignee of the present invention.

In these prior art instruments, an ion chamber, operating in the current mode, provides a very small direct current to the input of a very high gain operational amplifier configured as a current-to-voltage converter, the current gain of the operational amplifier being determined by a portion of the amplifier output current fed back into its input. The output of the amplifier drives a meter which indicates the amount of radiation per unit of time impinging on the ion chamber. The ion chamber, amplifier and meter constitute the basic components of a radiation measuring circuit well known in the art.

To change the range of operation of the measuring circuit, the current gain of the operational amplifier is changed. This gain change is accomplished by use of a resistor network including range selector switches, feedback current from the amplifier output being fed back to the amplifier input via the resistor network. By opening and closing the range selector switches, the user can vary the resistance of the network, and thus the amplifier current gain so as to set the measuring circuit at a desired operating range.

Because of the very high current gain of the amplifier and the very small current from the ion chamber that is being measured, the range selector switches, when in an "off" or non-conducting condition, must have a very high "off" resistance, typically on the order of $1 \times 10^{15}$ ohms or more, to minimize error causing, leakage current feedback into the input of the operational amplifier. Conventional mechanical switches, while capable of providing the required high "off" resistance, can become dirty so as to inject undesirable noise or leakage currents into the measuring circuit. In place of conventional mechanical switches, hermetically sealed magnetic reed switches have been successfully used as range selector switches in both of the above-noted prior art ion chamber instruments. To actuate the magnetic reed switches, a mechanical linkage is used to move magnets toward and away from the reed switches. While such mechanically actuated, magnetic reed switches have been successfully used as range selector switches in ion chamber instruments, they are still, because of their mechanical nature, costly, and are prone to failure. Also, spurious magnetic fields can cause the reed switches to inadvertently actuate leading to measurement errors.

While it may seem appropriate to one skilled in the art to substitute a semiconductor switch, such as a transistor, in place of the above-noted magnetic reed switch, current state of the art transistors, when in an "off" or non-conducting condition, do not, by themselves, have a high enough "off" resistance (typically only $1 \times 10^{13}$ ohms at best) to limit leakage feedback current to the required minimum levels.

SUMMARY OF THE INVENTION

In accordance with the present invention, a switch having a very high "off" resistance is provided. The switch is used as a range selector switch in an electronic circuit for measuring small currents, such as those generated by an ion chamber for measuring radioactivity.

The circuit includes a high gain amplifier, the gain of the amplifier, and thus the operating range of the measuring circuit, being determined by a portion of the amplifier output fed back via the range selector switch into the amplifier input. The amplifier input receives the small current to be measured, the output of the high gain amplifier driving an indicator such as a meter or the like.

The electronic range selector switch is constituted by first and second switches connected in series with each other. The first switch includes a first pair of electrodes functioning as switch poles, one of the electrodes of the first pair being connected to the amplifier input. The second switch includes a second pair of electrodes functioning as switch poles, one the electrodes of the second pair being connected to the amplifier output. The other electrode of the first pair is connected to the other electrode of the second pair to provide an interconnection point between the two series-connected switches.

In further accordance with the invention, means are provided for connecting the interconnection point between the two switches to the electrical neutral point of the measuring circuit only when both of the switches are in a non-conducting "off" condition. This means for connecting the interconnection point and the neutral point can be a third switch.

Such a configuration of elements provides a very high resistance switch that minimizes error causing, leakage current feedback from the amplifier output into its input via an open or "off" range selector switch.

BRIEF DESCRIPTION OF THE DRAWINGS

A fuller understanding of the invention may be had by referring to the following description and claims taken in conjunction with the accompanying drawings wherein:

DETAILED DESCRIPTION OF THE PREFERRED EMBODIMENTS

Figure 1:
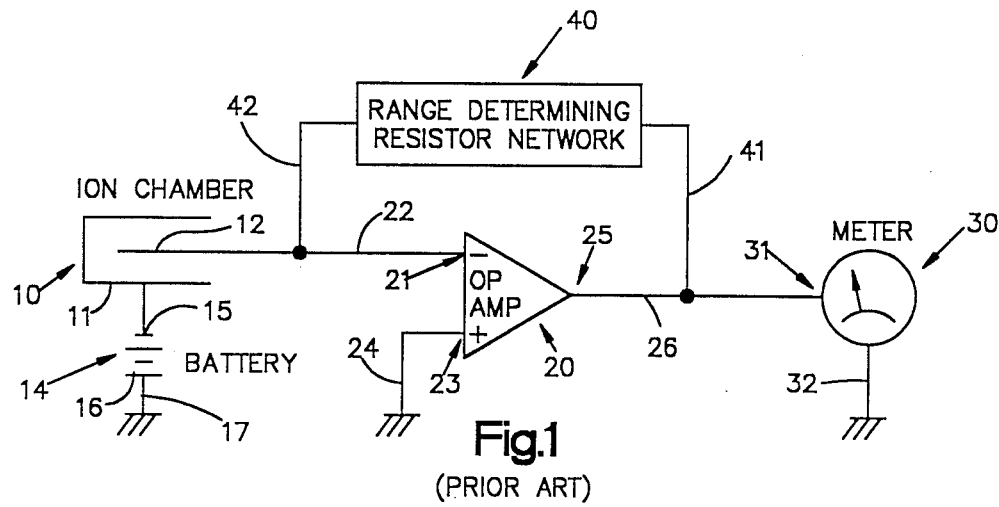
FIG. 1 is a diagram of the basic components of a known circuit for measuring small currents.

FIG. 1 illustrates the basic components of an ion chamber instrument for detecting and measuring radioactivity such as beta, gamma and x-ray radiation. The instrument includes an air-filled ion chamber 10 constituted by an outer electrode 11 functioning as a cathode and an inner electrode 12 functioning as an anode. The outer electrode 11 is formed of metal and is cup-shaped, while the inner electrode 12, in the form of a metal rod, is centered within the cup-shaped outer electrode 11 as illustrated. The electrodes 11, 12 are electrically isolated from each other by appropriate insulation means so that they can be maintained at different electrical potentials relative to each other. The potential across the electrodes 11, 12 is provided by a battery 14 of for example the lithium type. Typically, the battery voltage is approximately 30 volts. A negative pole 15 of the battery 14 is connected to the outer electrode 11, while a positive pole 16 of the battery is connected via a line 17 to the electrical neutral or ground point of a measuring circuit to be subsequently discussed. It is to be noted that the term "ground" as used herein is intended to refer to the voltage reference point in the measuring circuit i.e. the neutral point. As is well known in the art, ion chamber instruments are often portable, so that the voltage reference point or neutral or ground of the measuring circuit is not literally connected to earth ground.

Radiation impinging on the ion chamber 10, when energized by its associated battery 14, will cause ion pairs to be generated in the annular space between the ion chamber electrodes 11, 12 wherein the positive and negative ion pairs will migrate toward and be collected by the appropriate electrodes 11, 12. A very small direct current on the order of a few hundred femtoamperes ($1 \times 10^{-15}$ amperes) is thus generated. A time measurement of the quantity of such current is indicative of the amount of radiation impinging on the ion chamber 10 as a function of time. The measurement of the ion chamber generated current is provided by a very high gain amplifier in the preferred form of an operational amplifier 20 of the integrated circuit type, and by a conventional meter 30, of the D'Arsonval movement type, driven by the operational amplifier 20.

More specifically, the operational amplifier 20 includes an inverting input 21 connected to the inner electrode 12 of the ion chamber 10 by a current measuring input line 22. A non-inverting input 23 is connected via a reference line 24 to the neutral point of the measuring circuit as illustrated. An output 25 of the operational amplifier 20 is connected to an input 31 of the meter 30 via an output line 26. The meter 30 is referenced to the neutral point of the measuring circuit by a meter reference line 32. The operational amplifier 20 functions as a current-to-voltage converter wherein the very small direct current provided by the ion chamber 10 to the inverting input 21 of the amplifier 20 is greatly amplified to provide a proportional voltage on output line 26 for driving the meter 30, the meter visually indicating the magnitude of the input current on line 22, and thus the amount of radiation impinging on the ion chamber.

To change the operating range of the instrument illustrated in FIG. 1, it is known to provide a range determining resistor network connected between the inverting input 21 of the operational amplifier 20 and its output 25 wherein a portion of the signal from the amplifier output 25 is fed back to the inverting input 21. More specifically, one end of the range determining resistor network 40 is connected to output line 26 via an amplifier output feedback line 41 while the other end of the range determining resistor network 40 is connected to the current measuring input line 22 via an amplifier input feedback line 42. The resistance of the range determining resistor network 40 will determine the current gain of the operational amplifier 20 thus in turn determining the operating range of the ion chamber instrument. Thus, for measuring very low levels of radiation the network 40 will be set to provide the operational amplifier 20 with its highest current gain. For measuring successively higher levels of radiation the network 40 will be set for successively lower rates of current gain so that the meter 30 can function over several operating ranges.

Figure 2:
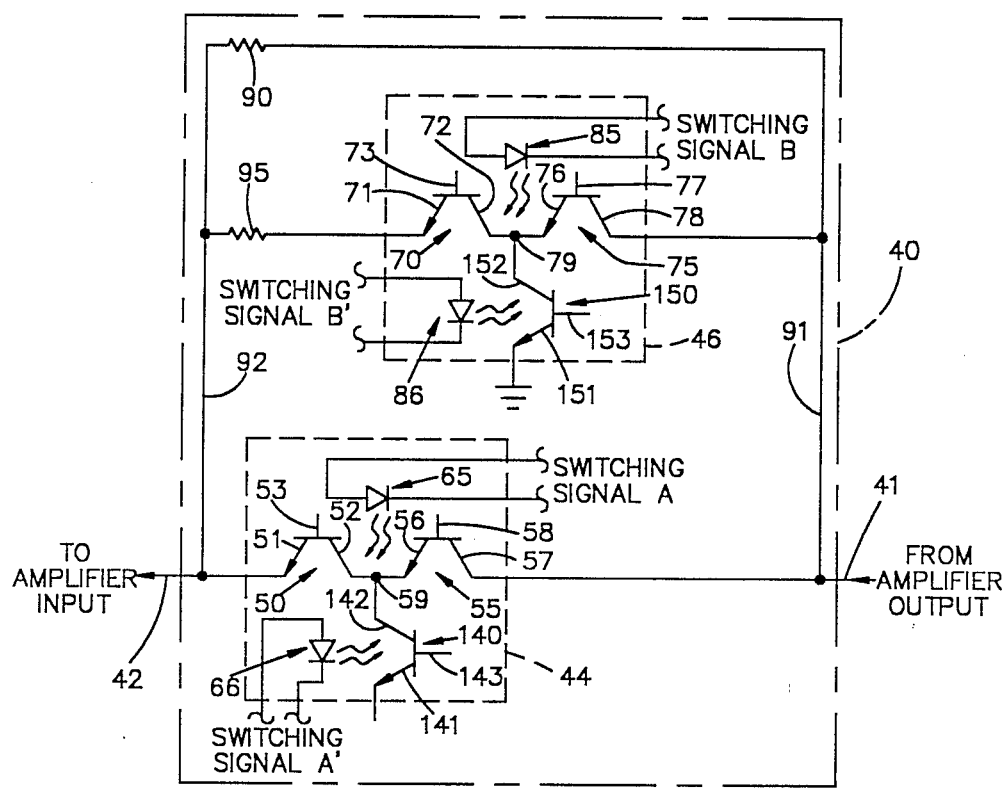
FIG. 2 is a schematic diagram of an embodiment of a high resistance range selector switch in accordance with the invention.

The present invention is directed to unique range selector switches for use in the range determining resistor network 40 as will now be discussed. Turning to FIG. 2, a first preferred embodiment of the present invention is illustrated. The range determining resistor network 40 is illustrated as receiving from the amplifier output feedback line 41 a current feedback signal which will be modified by the network 40 and then provided on amplifier input feedback line 42 as discussed earlier with regard to FIG. 1. The network 40 of FIG. 2 includes a first range selector switch 44 and an identical second range selector switch 46. Each switch 44, 46 has a conducting "on" condition and a nonconducting "off" condition as will become apparent, switches 44, 46 functioning as single pole single throw switches. The first range selector switch 44 is directly connected in series between feedback lines 41, 42. A first range determining resistor 90 is also directly connected in series between feedback lines 41, 42 via lines 91, 92. A second range determining resistor 95 has one of its ends connected to lines 92 with its other end being connected to line 91 via the second range selector switch 46. In a manner to be subsequently discussed, the first range selector switch 44 is switched on and off between its conducting and nonconducting conditions by a switching signal A, while a switching signal B switches the second range selector switch 46 between its conducting and nonconducting conditions.

As will be recognized by those skilled in the art, network 40 of FIG. 2 is capable of providing three resistance conditions that can affect the current gain of the amplifier 20 as discussed earlier with regard to FIG. 1. Whenever the first selector switch 44 is in a conducting or "on" condition, the output 25 of amplifier 20 (see FIG. 1) is directly connected to its input 21. In this condition, the resistance of the network 40 is effectively eliminated so that the instrument can be calibrated, i.e. the meter 30 (see FIG. 1) can be zeroed. This can be considered to be a first operating mode of the network 40.

A second operating mode of the network 40 is provided when the first selector switch 44 is in its nonconducting or "off" condition and the second selector switch 46 is likewise in a non-conducting or "off" condition. It will be recognized that, under these conditions, only the first range determining resistor 90 is connected in series between the output and input of the amplifier 20 discussed earlier. Thus, the resistance of the resistor 90 determines the current gain of the amplifier 20 and thus the operating range of the ion chamber instrument. To change the operating range of the instrument, the second range selector switch 46 is closed, i.e. it is switched into a fully conducting "on" condition by switching signal B, wherein the second range determining resistor 95 is now in parallel with the first range determining resistor 90, the effective parallel resistance of the two resistors 90, 95 determining the current gain of the amplifier 20. Thus, the network 40 provides an ion chamber instrument with two operating ranges and a calibration mode for zeroing the meter 30.

In order for the instrument as thus far discussed to operate accurately, the selector switches 44, 46 must have a low resistance when in an "on" or conducting condition and, more importantly, a very high resistance when in a nonconducting or "off" condition, such high resistance being on the order of $1 \times 10^{15}$ ohms. This is necessary to preclude leakage currents of even a very small magnitude across switches 44, 46 when in their "off" condition since such leakage currents could cause significant measurement errors. This is due to the very high current gain required of the amplifier 20 due to the very small currents provided by the ion chamber 10. In accordance with the present invention, the range selector switches 44, 46 meet the switching requirements set forth above.

With further reference to FIG. 2, the first selector switch 44 includes a first switch means in the form of a first bipolar transistor 50 that operates as a phototransistor switch. The transistor 50 includes an emitter electrode 51, a collector electrode 52 and a base electrode 53. The emitter electrode 51 and collector electrode 52 constitute a pair of electrodes which function as switch poles, the emitter electrode 51 being connected to the amplifier input feedback line 42, the collector electrode 52 being connected to an interconnection point 59. The base electrode 53 is not connected and thus "floats" so that the transistor 50 can function as a phototransistor in a manner well known in the art.

A second switch means in the illustrated form of a second bipolar transistor 55 that operates as a phototransistor switch includes an emitter electrode 56, a collector electrode 57, and a base electrode 58. The emitter and collector electrodes 56, 57 constitute a pair of electrodes which function as switch poles. It can be seen that the emitter electrode 56 is connected to the interconnection point 59 while the collector electrode 57 is connected to the amplifier output feedback line 41. The base electrode 58 is not connected and thus "floats" so that the transistor 55 can function as a phototransistor in a manner identical to the first transistor 50. The collector electrode 52 of the first transistor 50 and the emitter electrode 56 of the second transistor 55 are connected to each other at the interconnection point 59.

The two transistors 50, 55 are switched between their fully conducting and nonconducting conditions by light emitted from a light emitting diode 65 that is energized by the switching signal A. The junctions of both transistors 50, 55 are exposed to the light from the single light emitting diode 65 which is placed physically adjacent to and between the junctions of the two transistors 50, 55. When the light emitting diode 65 is not energized i.e. when it is in its nonilluminated condition, the transistors 50, 55 are in their "off" or nonconducting condition, the resistance across their emitter and collector electrodes being at its maximum. When switching signal A energizes light emitting diode 65, the light emitted therefrom impinges upon the junctions of the transistors 50, 55 wherein they switch to their low resistant conditions so as to connect the amplifier output feedback line 41 with the amplifier input feedback line 42 to allow "zeroing" of the meter 30 as discussed earlier with regard to FIG. 1.

With reference to the second selector switch 46 it can be seen to include, in an identical manner as discussed with regard to switch 44, a first transistor 70 and a second transistor 75 the transistor 70 having an emitter electrode 71, a collector electrode 72 and a disconnected base electrode 73. The second transistor 75 includes an emitter electrode 76, a collector electrode 77 and a disconnected base electrode 78. An interconnection point 79 is provided to interconnect the collector electrode 72 of transistor 70 and the emitter electrode 76 of transistor 75.

Also, it will be recognized that the use of optical coupling, i.e. the use of diodes 65, 85, to switch the transitors 50, 55 and 70, 75 advantageously precludes the injection into the inverting input of the amplifier of any portion of the switching signals A and B. Isolation provided by such optical coupling allows low cost, user operated mechanical switches for controlling the switching on and off of the light emitting diodes 65, 85. The range determining resistor network 40 including the electronic range selector switches 44, 46 has been found to be extremely reliable and low in cost as compared to the prior art use of magnetic reed switches as discussed earlier. In particular, unlike magnetic reed switches, the electronic switches 44, 46 illustrated in FIG. 2 do not respond to spurious magnetic fields and, because of their purely electronic nature, are not prone to mechanical failure.

Switch 44 includes a third bipolar transistor 140 having an emitter electrode 141 connected to the electrical neutral or ground point of the circuit as illustrated, and a collector electrode 142 connected to the interconnection point 59. The transistor 140 also includes a disconnected base electrode 143 wherein the transistor 140 functions as a phototransistor switch in response to light emitted by another light emitting diode 66 as illustrated. In accordance with the present invention, when transistors 50, 55 are switched to their conducting "on" condition by light from diode 65, transistor 140 is in its nonconducting condition so as to isolate interconnection point 59 from the electrical neutral or ground point of the measuring circuit. When light emitting diode 65 is switched off by switching signal A to in turn switch off transistors 50, 55, light emitting diode 66 is turned on by switching signal A' so as to switch on transistor 140. In this condition, the interconnection point 59 is electrically connected via transistor 140 to the electrical neutral or ground point of the measuring circuit.

In a similar manner, switch 46 is provided with a third bipolar transistor 150 having its collector electrode 152 connected to the interconnection point 79 and its emitter electrode 151 connected to the electrical neutral point of the measuring circuit as illustrated. The base electrode 153 of the transistor 150 is not connected wherein the transistor 150 can function as a photodiode switch in response to light from another light emitting diode 86 turned on and off by a switching signal B' as illustrated. Transistor 150 performs a function identical to transistor 140 discussed earlier with regard to transistors 70, 75. More specifically, when switching signal B energizes diode 85 it illuminates the turn on switches 70, 75. Under these conditions, light emitting diode 86 is in an "off" condition wherein transistor 150 is also in an off condition to isolate interconnection point 79 from the electrical neutral or ground point of the measuring circuit. When switching signal B turns off light emitting diode 85, switching signal B' turns on light emitting diode 86 so that transistor 150 conducts so as to ground the interconnection point 79 i.e. interconnection point 79 is electrically connected via switched on transistor 150 to the electrical neutral or ground point of the circuit.

From the foregoing it can be seen that an electronic range selector switch has been provided for use in an ion chamber measuring instrument. Such an electronic switch could have applications apart from ion chamber instrumentation. It should also be noted that while switches 50, 55, 70, 75, 140 and 150 are illustrated as semiconductor electronic type switches, simple mechanical switches could be substituted in their places without departing from the scope of the invention, although semiconductor switches are clearly preferred.

Finally, it should be evident that this disclosure is by way of example and various changes could be made by adding, modifying or eliminating details without departing from the fair scope of the teaching contained in this disclosure. This invention is therefore not limited to particular details of the disclosure except to the extent that the following claims are necessarily so limited.

What is claimed is:

1. An instrument for measuring radioactivity, the instrument including a high gain amplifier having an input and an output, wherein the gain of the amplifier is determined by a portion of the amplifier output fed back into the amplifier input, the amplifier input receiving a small current to be measured, the amplifier output driving an indicator, and a range selector switch connected in series between said input and output, switching of said selector switch changing said portion of the amplifier output fed back into the amplifier input so as to change the gain of the amplifier and thus determine the operating range of the instrument, said range selector switch comprising:

a first switch means having a conducting "on" condition and a non-conducting "off" condition, said first switch means including a first pair of electrodes functioning as switch poles, one of said electrodes of said first pair being connected to said amplifier input;

a second switch means having a conducting "on" condition and a non-conducting "off" condition, said second switch means including a second pair of electrodes functioning as switch poles, one of said electrodes of said second pair being connected to said amplifier output, the other electrode of said first pair being connected to the other electrode of said second pair to provide an interconnection point between said switch means wherein said switch means are in series with each other; and a third switch means having a conducting "on" condition and a non-conducting "off" condition, connected between said interconnection point and the electrical neutral point of said instrument to electrically ground said interconnection point between said switch means only when said first and second switch means are in said non-conducting "off" condition and said third switch means is in said conducting "on" condition, whereby the operating range of the amplifier is accurately controlled by eliminating leakage through the selector switch.

* * * * *

UNITED STATES PATENT AND TRADEMARK OFFICE
CERTIFICATE OF CORRECTION

PATENT NO. : 4,977,367

DATED : December 11, 1990

INVENTOR(S) : Johnston

It is certified that error appears in the above-identified patent and that said Letters Patent is hereby corrected as shown below:

Column 5, line 65, after "transistor 75.", insert --Another light emitting diode 85 can be turned on and off by switching signal B to activate or deactivate the transistors 70, 75 which are serially connected with each other and with the second range determining resistor 95 between lines 91 and 92 as discussed earlier.--

Signed and Sealed this

Twelfth Day of May, 1992

Attest:

DOUGLAS B. COMER

Attesting Officer

Acting Commissioner of Patents and Trademarks